United States Patent
Zhang et al.

(10) Patent No.: US 11,209,592 B2
(45) Date of Patent: Dec. 28, 2021

(54) INTEGRATED ACTIVE DEVICES WITH ENHANCED OPTICAL COUPLING TO DIELECTRIC WAVEGUIDES

(71) Applicants: Chong Zhang, Santa Barbara, CA (US); Hyun Dai Park, Goleta, CA (US); Minh Tran, Goleta, CA (US); Tin Komljenovic, Santa Barbara, CA (US)

(72) Inventors: Chong Zhang, Santa Barbara, CA (US); Hyun Dai Park, Goleta, CA (US); Minh Tran, Goleta, CA (US); Tin Komljenovic, Santa Barbara, CA (US)

(73) Assignee: Nexus Photonics LLC, Santa Barbara, CA (US)

( * ) Notice: Subject to any disclaimer, the term of this patent is extended or adjusted under 35 U.S.C. 154(b) by 0 days.

(21) Appl. No.: 17/015,785

(22) Filed: Sep. 9, 2020

(65) Prior Publication Data
US 2021/0373235 A1  Dec. 2, 2021

Related U.S. Application Data

(60) Provisional application No. 63/033,215, filed on Jun. 2, 2020.

(51) Int. Cl.
*G02B 6/122* (2006.01)
*G02B 6/12* (2006.01)
(Continued)

(52) U.S. Cl.
CPC ....... *G02B 6/1228* (2013.01); *G02B 6/12004* (2013.01); *G02B 2006/12121* (2013.01); *H01S 5/026* (2013.01); *H01S 5/1014* (2013.01)

(58) Field of Classification Search
None
See application file for complete search history.

(56) References Cited

U.S. PATENT DOCUMENTS

| | | | | |
|---|---|---|---|---|
| 6,083,843 A | * | 7/2000 | Ohja | G02B 6/30 216/24 |
| 7,643,710 B1 | * | 1/2010 | Liu | B82Y 20/00 385/43 |

(Continued)

*Primary Examiner* — Jerry Rahll
(74) *Attorney, Agent, or Firm* — Shalini Venkatesh

(57) ABSTRACT

A device comprises first, second and third elements fabricated on a common substrate. The first element comprises an active waveguide structure comprising: one portion, of effective cross-sectional area A1, supporting a first optical mode; and a second portion, butt-coupled to the first portion, of effective cross-sectional area A2>A1. The second element comprises a passive waveguide structure supporting a second optical mode. The third element, at least partly butt-coupled to the second portion, comprises an intermediate waveguide structure supporting intermediate optical modes. If the first optical mode differs from the second optical mode by more than a predetermined amount, a tapered waveguide structure in at least one of the second and third elements facilitates efficient adiabatic transformation between the first optical mode and one intermediate optical mode. No adiabatic transformation occurs between any intermediate optical mode and the first optical mode. Mutual alignments of the elements are defined using lithographic marks.

20 Claims, 6 Drawing Sheets

(51) Int. Cl.
    *H01S 5/026*     (2006.01)
    *H01S 5/10*     (2021.01)

(56) References Cited

U.S. PATENT DOCUMENTS

| | | | |
|---|---|---|---|
| 10,718,898 B1* | 7/2020 | Park | G02B 6/12004 |
| 2003/0068152 A1* | 4/2003 | Gunn, III | B82Y 20/00 |
| | | | 385/129 |
| 2010/0040327 A1* | 2/2010 | Deki | G02B 6/1228 |
| | | | 385/28 |
| 2013/0156370 A1* | 6/2013 | Kim | G02B 6/305 |
| | | | 385/14 |
| 2013/0322816 A1* | 12/2013 | Takahashi | G02B 6/305 |
| | | | 385/27 |
| 2014/0294341 A1* | 10/2014 | Hatori | G02B 6/12 |
| | | | 385/14 |
| 2015/0086153 A1* | 3/2015 | Ono | G02B 6/12002 |
| | | | 385/11 |
| 2016/0139334 A1* | 5/2016 | Sakakibara | G02B 6/12002 |
| | | | 385/43 |
| 2016/0247525 A1* | 8/2016 | Lee | G11B 5/314 |
| 2016/0327742 A1* | 11/2016 | Collins | G02B 6/125 |
| 2017/0045686 A1* | 2/2017 | Lee | G02B 6/1228 |
| 2018/0039022 A1* | 2/2018 | Ahn | G02B 6/12004 |
| 2018/0100970 A1* | 4/2018 | Park | G02B 6/125 |

* cited by examiner

INTEGRATED ACTIVE DEVICES WITH ENHANCED OPTICAL COUPLING TO DIELECTRIC WAVEGUIDES

CROSS-REFERENCES TO RELATED APPLICATIONS

This application claims priority from U.S. Provisional Patent Application Ser. No. 63/033,215, entitled "INTEGRATED ACTIVE DEVICES WITH ENHANCED OPTICAL COUPLING TO DIELECTRIC WAVEGUIDES", filed on 2 Jun. 2020, which is hereby incorporated by reference as if set forth in full in this application for all purposes.

This application is related to U.S. patent application Ser. No. 16/254,883, filed 23 Jan. 2019, patented as U.S. Pat. No. 10,718,898, which is incorporated by reference as if set forth in full in this application for all purposes.

FIELD OF THE INVENTION

The present invention relates to semiconductor processing. More specifically, certain embodiments of the invention relate to a method and system for realization of photonic integrated circuits using dissimilar materials that are optically coupled.

BACKGROUND OF THE INVENTION

A photonic integrated circuit (PIC) or integrated optical circuit is a device that integrates multiple photonic functions and as such is analogous to an electronic integrated circuit. The major difference between the two is that a photonic integrated circuit provides functions for information signals imposed on optical carrier waves. The material platform most commercially utilized for photonic integrated circuits is indium phosphide (InP), which allows for the integration of various optically active and passive functions on the same chip. Although many current PICs are realized in InP platforms, there has been significant research in the past decade in using silicon rather than InP for the realization of PICs, due to some superior characteristics as well as superior processing capabilities for the former material, that leverage the investment already made for electronic integrated circuits.

The biggest drawback in using silicon for PICs is that it is an indirect bandgap material which makes it hard to provide electrically pumped sources. This problem is generally solved by assembling PICs comprising two or more chips made from dissimilar materials in separate processes. Such an approach is challenging due to a need for very fine alignment, which increases packaging costs and introduces scaling limitations. Another approach to solving the bandgap problem is to bond two dissimilar materials and process them together, removing the need for precise alignment during the bonding of larger pieces or complete wafers of the dissimilar materials, and allowing for mass fabrication. In this disclosure, we use the term "hybrid" to describe the first approach that includes precise assembly of separately processed parts, and we use the term "heterogeneous" to describe the latter approach of bonding two materials and then processing the bonded result to define the waveguides and other components of interest.

To transfer the optical signal between dissimilar materials, the heterogeneous approach utilizes tapers whose dimensions are gradually reduced until the effective mode refractive indices of dissimilar materials match and there is efficient power transfer. This approach generally works well when materials have similar refractive indices as is the case with silicon and InP. In cases where there is larger difference in effective indices, such as between e.g. SiN and InP or GaN, the requirements on taper tip dimensions become prohibitive limiting efficient power transfer. Specifically, extremely small taper tip widths (of the order of nanometers) may be necessary to provide good coupling. Achieving such dimensions is complex and may be cost prohibitive.

Although InP and silicon-based PICs address many current needs, they have some limitations; among them the fact that the operating wavelength range is limited by material absorption increasing the losses, and the fact that there is a limit on the maximum optical intensities and consequently optical powers that a PIC can handle. To address these limitations, alternate waveguide materials have been considered, such as SiN, $TiO_2$, $Ta_2O_5$, AlN or others. In general, such dielectric waveguides have higher bandgap energies which provides better high-power handling and transparency at shorter wavelength, but, in general such materials also have lower refractive indices. E.g. SiN with bandgap of ~5 eV has refractive index of ~2, AlN has bandgap of ~6 eV and refractive index of around ~2, and $SiO_2$ with bandgap of ~8.9 eV has refractive index of ~1.44. For comparison, the refractive index of GaAs and InP is >3. This makes the tapered approach challenging.

The alternative hybrid approach suffers from the drawbacks already mentioned above, namely the need for precise alignment, and correspondingly complex packaging and scaling limitations.

A recent approach to the problems discussed above was presented in U.S. Pat. No. 10,718,898, referenced above, employing butt-coupling in combination with a mode-converter to allow the heterogenous process to be used without the need for extremely small taper widths. However, in situations where high optical power must be handled, in the field of high-power semiconductor lasers, for example, reliability problems may arise due to very high optical intensities at microscopically rough interfaces between the waveguides formed in the dissimilar materials, roughness being an inevitable outcome of practical fabrication processes such as etching, especially if multiple lithography steps are involved. The optical intensities are typically very high due to the high output power being channeled into waveguides of small effective[1] cross-sectional area, therefore leading to high carrier densities and/or high optical intensities. Inadequate thermal dissipation paths for the thermal loading resulting from high powers therefore can lead to reduced device lifetime or even catastrophic optical damage (COD).

[1] The effective cross-sectional area of a waveguide is defined as the cross-sectional area outside which no significant part of the optical modes supported by the waveguide could reasonably be expected to extend. In some cases, the threshold can be 90%, 99%, 99.9% of the optical mode power confined inside the effective cross-sectional area or any other threshold generally greater than 90%. In most cases of strip (rectangular) and ridge (pedestal) guides with high confinement, the effective cross-sectional area is very similar to the cross-sectional area bounded by the strip or ridge, but in some cases of more complicated shapes, where electrical contacts are made on top of very thin but long lateral extensions of the waveguide cross-section, for example, the effective cross-section may be much smaller than the area strictly defined by the boundaries of the waveguide.

There remains, therefore, a need for a method that provides efficient optical coupling between materials (such as, for example, the III-V materials mentioned above, used for active devices, and simple dielectric materials used for waveguides) with dissimilar refractive indices, avoiding prohibitively narrow taper tips, and therefore offering easier fabrication, but also addressing the thermal issues inherent with high optical power operation. This would allow for scalable integration of materials for the realization of high power PICs able to handle high optical power compared to typical Si-waveguide-based PICs. Ideally, PICs made by such a method would be operable over a wide wavelength range from ultra-violet (UV) to infra-red (IR).

DETAILED DESCRIPTION

Described herein are embodiments of a method and system for realization of photonic integrated circuits using wafer bonding and deposition of dissimilar materials where optical coupling is improved by use of mode conversion and a butt-coupling scheme.

In the following detailed description, reference is made to the accompanying drawings which form a part hereof, wherein like numerals designate like parts throughout, and in which are shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

The description may use perspective-based descriptions such as top/bottom, in/out, over/under, and the like. Such descriptions are merely used to facilitate the discussion and are not intended to restrict the application of embodiments described herein to any particular orientation. The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

Figure 5:
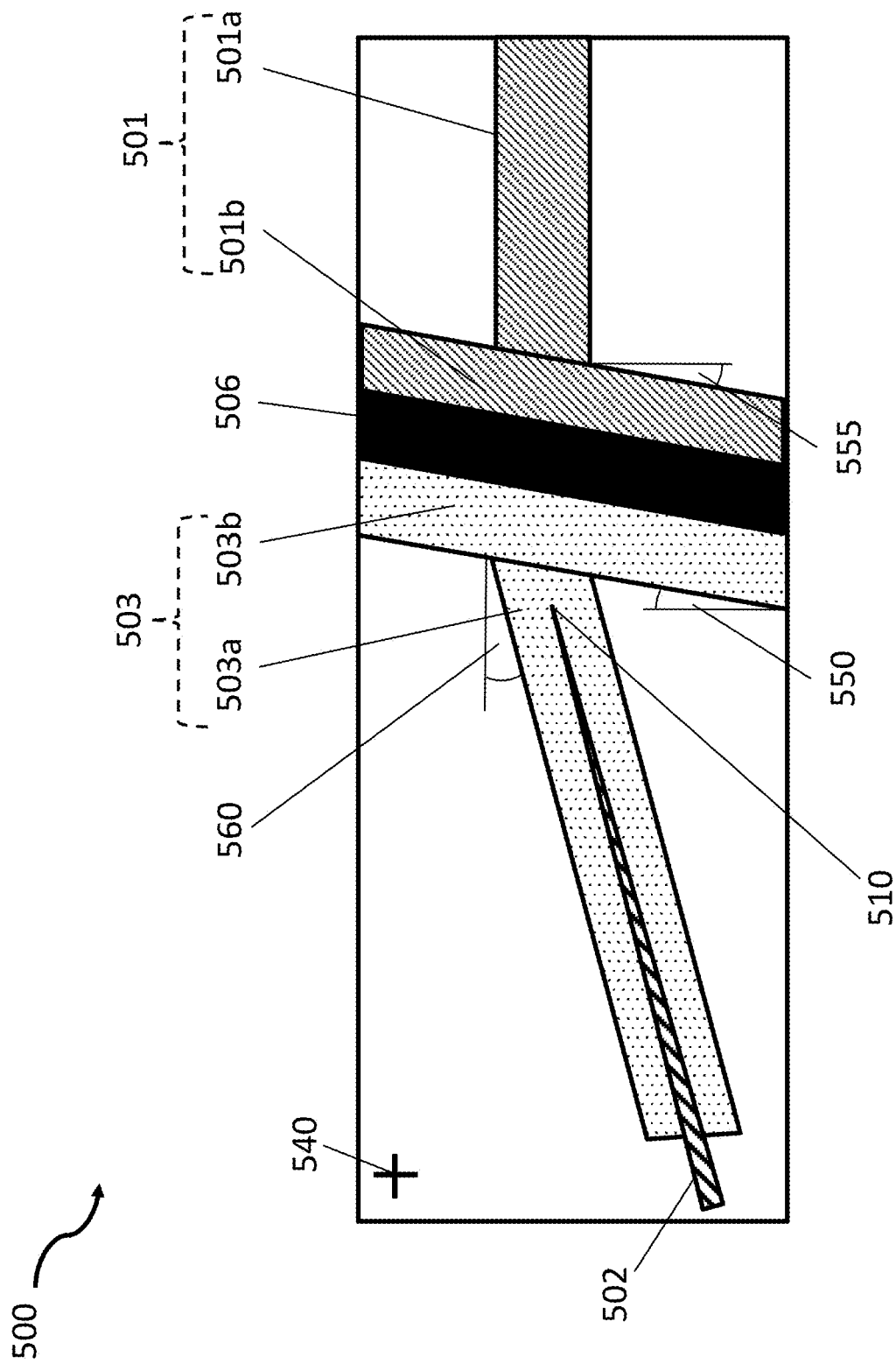
FIG. 5 shows a cross-sectional top-down view of a device according to some embodiments of the present invention.

The term "coupled with," along with its derivatives, may be used herein. "Coupled" may mean one or more of the following. "Coupled" may mean that two or more elements are in direct physical, electrical, or optical contact. However, "coupled" may also mean that two or more elements indirectly contact each other, but yet still cooperate or interact with each other, and may mean that one or more other elements are coupled or connected between the elements that are said to be coupled with each other. The term "directly coupled" means that two or more elements are in direct contact in at least part of their surfaces. The term "butt-coupled" is used herein in its normal sense of meaning an "end-on" or axial coupling, where there is minimal or zero axial offset between the elements in question. The axial offset may be, for example, slightly greater than zero in cases where a thin intervening layer of some sort is formed between the elements, as described below with regard to elements 106, 206 etc. It should be noted that the axes of two waveguide structures or elements need not be colinear for them to be accurately described as being butt-coupled. In other words, the interface between the elements need not be perpendicular to either axis. FIG. 5 embodiments discussed below are exemplary of such possibilities.

Terms "active device" and/or "active region", may be used herein. A device or a region of a device called active is capable of light generation, amplification, modulation and/or detection. We use active device and active region interchangeably meaning either one of them and/or both. This is in contrast to "passive device" and/or "passive region" whose principal function is to confine and guide light, and or provide splitting, combining, filtering and/or other functionalities that are commonly associated with passive devices. Some passive devices can provide functions overlapping with active device functionality, such as e.g. phase tuning implemented using thermal effects or similar that can provide modulation. The difference in this case is in performance, with active devices generally providing higher efficiencies, lower power consumption, larger bandwidth and/or other benefits. No absolute distinction should be assumed between "active" and "passive" based purely on material composition or device structure. A silicon device, for example, may be considered active under certain conditions of modulation, or detection of low wavelength radiation, but passive in most other situations.

Figure 1A:
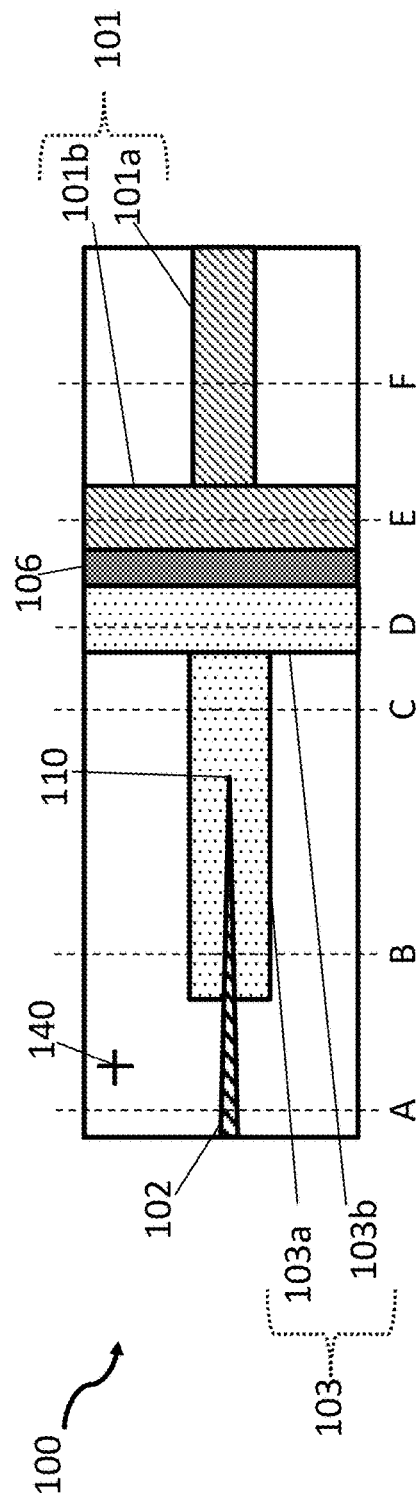
FIG. 1A shows a cross-sectional top-down view of a device according to some embodiments of the present invention.
Figure 1B:
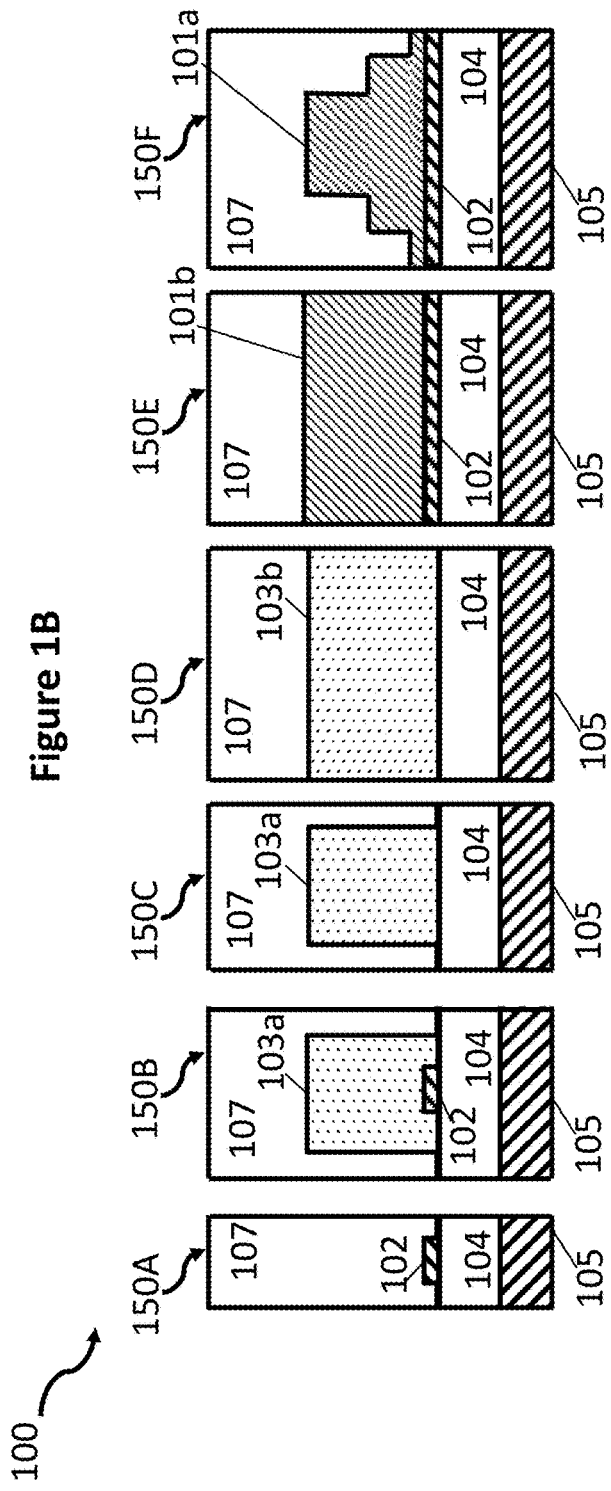
FIG. 1B shows cross-sectional end-on views of the device of FIG. 1A

FIG. 1A offers a top-down view of an integrated photonic device 100 utilizing butt-coupling and mode conversion for efficient coupling between dissimilar materials, and FIG. 1B offers several corresponding end-on cross-sectional views 150A, 150B, 150C, 150D, 150E and 150F of a device according to some embodiments of the present invention. The location of end-on cross-sectional views are illustrated on top-view with letters A-F.

The exemplary end-on cross-sections include a substrate 105 that can be any suitable substrate for semiconductor and dielectric processing, such as Si, InP, GaAs, GaN, quartz, silicon-on-insulator, sapphire, and/or other materials known in the art. The substrate can also incorporate buffer layers, multilayer structures for filtering and/or reflecting the incident light or other materials providing additional functionality (e.g. layers with high thermal conduction for more efficient heatsinking). A layer of second material 104 is deposited, grown, transferred, bonded or otherwise attached to the top surface of substrate 105 using techniques known in the field. The main purpose of layer 104 is to provide optical cladding for materials 101 (comprising 101a and 101b, to be described below), 102, and/or 103 (comprising of 103a and 103b, to be described below), if necessary to form an optical waveguide. Optical waveguides are commonly realized by placing higher refractive index core between two lower refractive index layers to confine the optical wave. In some embodiments, layer 104 is omitted and substrate 105 itself serves as a cladding.

Layer 102 is deposited, grown, transferred, bonded or otherwise attached to the top of layer 104 if present, and/or to the top of substrate 105, using techniques known in the field. The refractive index of layer 102 is higher than the refractive index of layer 104 if present, or, if layer 104 is not present, the refractive index of layer 102 is higher than the refractive index of substrate 105. In one embodiment, the material of layer 102 may include, but is not limited to, one or more of SiN, TiO2, Ta2O5, SiO2, Al2O3, LiNbO3 and AlN. In some embodiments, other common dielectric materials may be used for layer 102. In other embodiments, a semiconductor material used for layer 102 may include, but not be limited to, one or more of Si, GaAs, AlGaAs, InP.

Either or both of layers 104 and 102 can be patterned, etched, or redeposited as is common in the art before layer 101 (comprising at least two functional parts 101a and 101b that will be explained later) is bonded on top of the whole or part of the corresponding (104, 102) top surface. Said bonding can be direct molecular bonding or can use additional materials to facilitate bonding such as e.g. metal layers or polymer films as is known in the art. Layer 101 makes up what is commonly called an active region, and may be made up of materials including, but not limited to, InP and InP-based ternary and quaternary materials, GaAs and GaAs based ternary and quaternary materials, GaN, GaP, InAs and InSb and their variations and derivatives. Layer 101 in one embodiment is multilayered, comprising layers providing both optical and electrical confinement as well as electrical contacts, as is known in the art for active devices. Said multilayers generally providing vertical confinement. In yet another embodiment, layer 101 uses lower layers 102, 104 and/or 105 to provide electrical and/or optical confinement and one or more electrical contacts. Horizontal confinement, in one of the embodiments, is provided by defining a ridge type structure (as shown in 150F). Horizontal confinement can also be provided by generating a strip structure (not shown), by implants or other techniques in the field. In either case, the intent of confinement structures is to control the position and shape of the optical mode and optimize the interaction between the optical mode and injected, generated and/or depleted carriers.

In some embodiments, layer 101 can be efficiently electrically pumped to generate optical emission and gain. The present invention enables efficient optical coupling between waveguides formed in layer 101 and layer 102. Said materials 102 can provide additional functionality such as wideband transparency, high intensity handling, phase shifting by temperature, strain or other tuning mechanisms, combining, splitting, filtering and/or others as is known in the art.

Efficient coupling is facilitated by layer 103 (that in certain embodiments comprises of at least two functional parts 103a and 103b that will be explained later), and, in cases where layer 106 is present, by layer 106. In some embodiments, part 103b of layer 103 is not present. Optional layer 106 primarily serves as either an anti-reflective or a highly-reflective coating at the interface between layer 101 and layer 103. Layer 106 can also serve as a passivation layer for the facet/sidewall of layer 101. Layer 103 serves as an intermediate waveguide that facilitates efficient coupling between modes supported by waveguide whose core is formed by layer 102 and waveguide formed by layer 101 as will be explained with the help of FIGS. 3A and 3B. Layer 103 may comprise a dielectric, a polymer and/or any other suitable material. The upper cladding layer 107 for waveguides realized in 103, 101, and/or 102 can be ambient air (meaning no cladding material is actually deposited) or can be any other deliberately deposited suitable material as shown in FIG. 1B, including, but not limited to, a polymer, SiO2, SiNx, etc.

Dimensions of layer 102 can be tapered as shown in FIGS. 1A and 1B forming a taper tip 110. In certain embodiments, one or both of the waveguides defined in layers 102 and 103a are tapered (not shown). The requirements on the dimensions of said taper tips are relaxed with proper choice of materials allowing for mass fabrication using standard lithography tools.

The width of part 101a, as shown in cross section view 150F, can vary depending on the device design and wavelength of operation, but is generally in the range of 0.5 µm to 100 µm or more for very high power designs as is common in the field of high-power semiconductor lasers. In all cases, the power generally scales with the size, and field intensities are very high due to high output power and low cross-sectional volume. A potential point of failure is the interface between layer 101 and 103, or layer 101 and 106 that can contain high carrier densities and/or high optical intensities. Due to the nature of fabrication, where said facet/interface is commonly etched or defined with similar semiconductor processing technique, there is an increased roughness leading to increase in losses (e.g. related to surface recombination) and consequently higher thermal load. The problem is further magnified if said interface is defined during multiple processing steps, e.g. if fabricated simultaneously as the cross-section structure 101a as shown in 150F due to misalignment inherent to multiple lithography steps. All this can lead to reduced device lifetime or even catastrophic optical damage (COD).

To address said problem, a wall 101b is defined as a second part of the same 101 structure but with enlarged lateral dimensions. In some embodiments, the wall 101b can be patterned sharing the same process flow used to define structure 101a. In yet another embodiment, the wall is defined in separate processing steps from structure 101a which can improve the surface quality removing the misalignment considerations related to facet quality mentioned above. The effects of wall 101b will be explained with the help of FIGS. 2 and 3. Optionally, in some embodiments a wall 103b in structure 103 is introduced. Said wall 103b, although helping in some embodiments with above mentioned problem of high optical power and thermal dissipation, primarily serves to relax the alignment tolerances on the lithography when defining structure 103 in respect to structure 101.

One or more lithography alignment marks 140 are present to facilitate precise alignment between the layers formed during various processing steps.

Figure 2A:
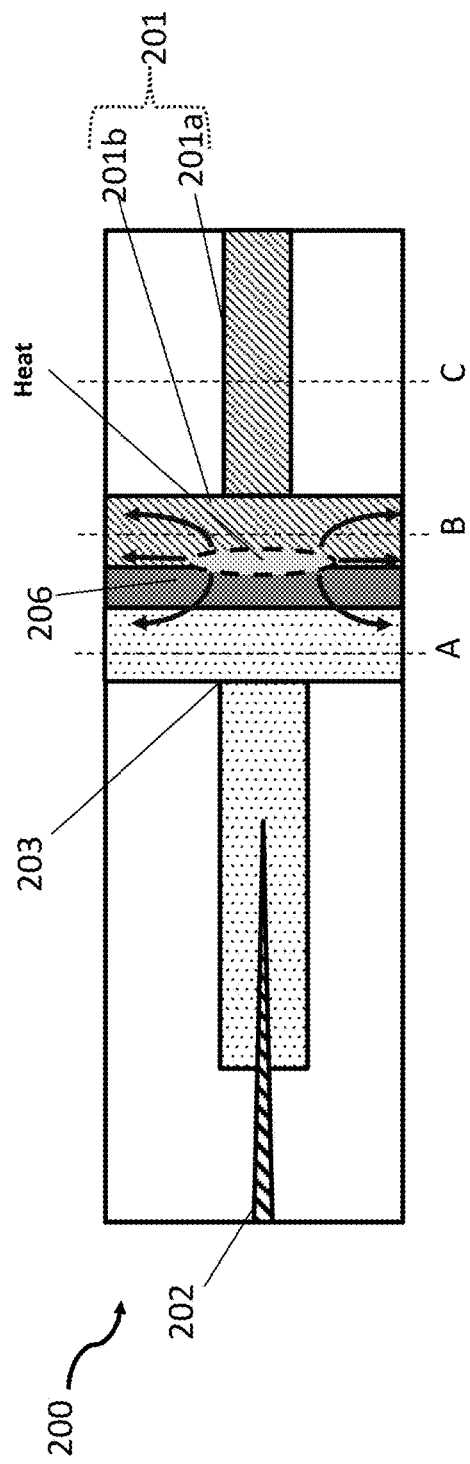
FIG. 2A shows a cross-sectional top-down view of a device according to some embodiments of the present invention.
Figure 2B:
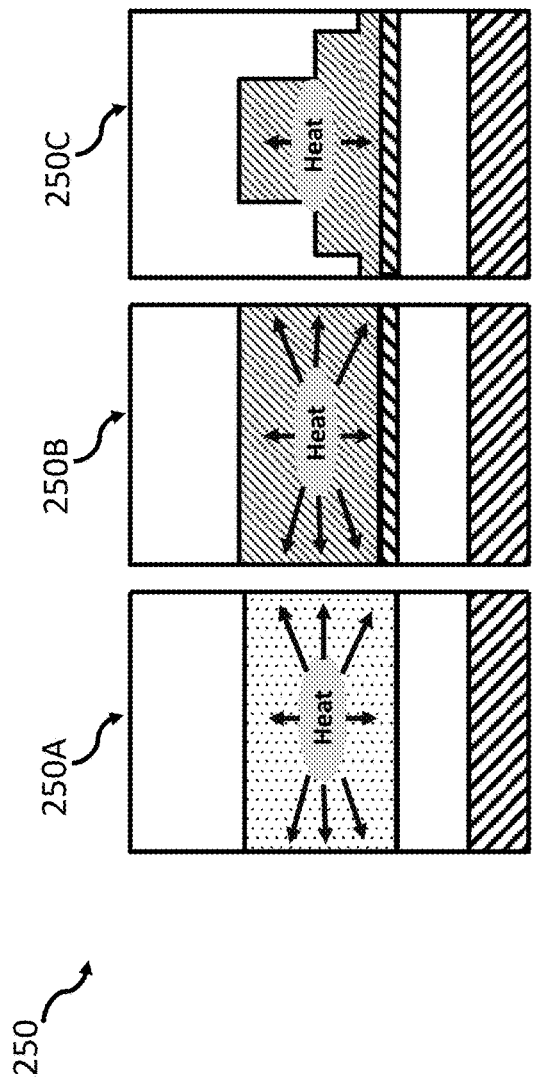
FIG. 2B shows cross-sectional end-on views of the device of FIG. 2A

FIG. 2A offers a top-down view of an integrated photonic device 200 utilizing butt-coupling and mode conversion for efficient coupling between dissimilar materials, and FIG. 2B offers several corresponding end-on cross-sectional views 250A, 250B and 250C of a device according to some embodiments of the present invention. The location of end-on cross-sectional views are illustrated on top-view with letters A-C.

FIGS. 2A and 2B serve to illustrate the benefits of introducing wall structures for improved facet quality and high-power operation. Key layers described in detail with respect to FIGS. 1A and 1B, are shown in FIG. 2A and include active layer 201 (comprising 201a and wall 201b), passive layer 202 and layer 203 facilitating efficient coupling between 201 and 202. Layer 206 is optional and serves as either an anti-reflective or a highly-reflective coating at the interface between layer 201 and layer 203. In some embodiments, layer 206 also serves to passivate the facet defined at the edge of layer 201 that is butt-coupled to layer 203.

The facet between layers 201 and 203 or layers 201 and 206, if 206 is present, is under stress due to high carrier densities and/or high optical intensities at the interface. Imperfections at the interface due to processing resulting with higher roughness, defects and/or other can result with increased losses leading to even higher thermal load. This effect can act as positive feedback: increase of temperature can increase losses, which in turn further increase temperature, etc. leading to device lifetime degradation or even COD. The wall increases the area for thermal dissipation as shown in direct comparison of the cross-sections 250B showing the wall and 250C showing the nominal active area significantly mitigating the thermal issue of high optical powers. Wall defined in structure 203, as shown in cross-section 250A, can further help with thermal issue but also relaxes the alignment tolerance between lithography steps defining the structure 201 including the wall 201b and lithography steps defining the structure 203. In some embodiments, the facet of the wall defined in layer 201 that is butt-coupled to layer 203 is defined in a single etch step which results with higher quality facet as there are no misalignment issues due to multiple lithography steps. Higher quality facet can provide higher reflection and/or higher transmission, depending on the nature of the device, but it primarily results with lower losses and consequently lower thermal load at the interface. The arrows in FIG. 2B show potential thermal paths for the heat generated at the facet, and thermal impedance can be significantly reduced with the introduction of wall structures.

The term "wall structure" is used herein as describing a portion of a waveguide structure with effective cross-sectional area significantly larger than the effective cross-sectional area of the remainder of the waveguide structure, to which the wall structure is butt-coupled.

Figure 3A:
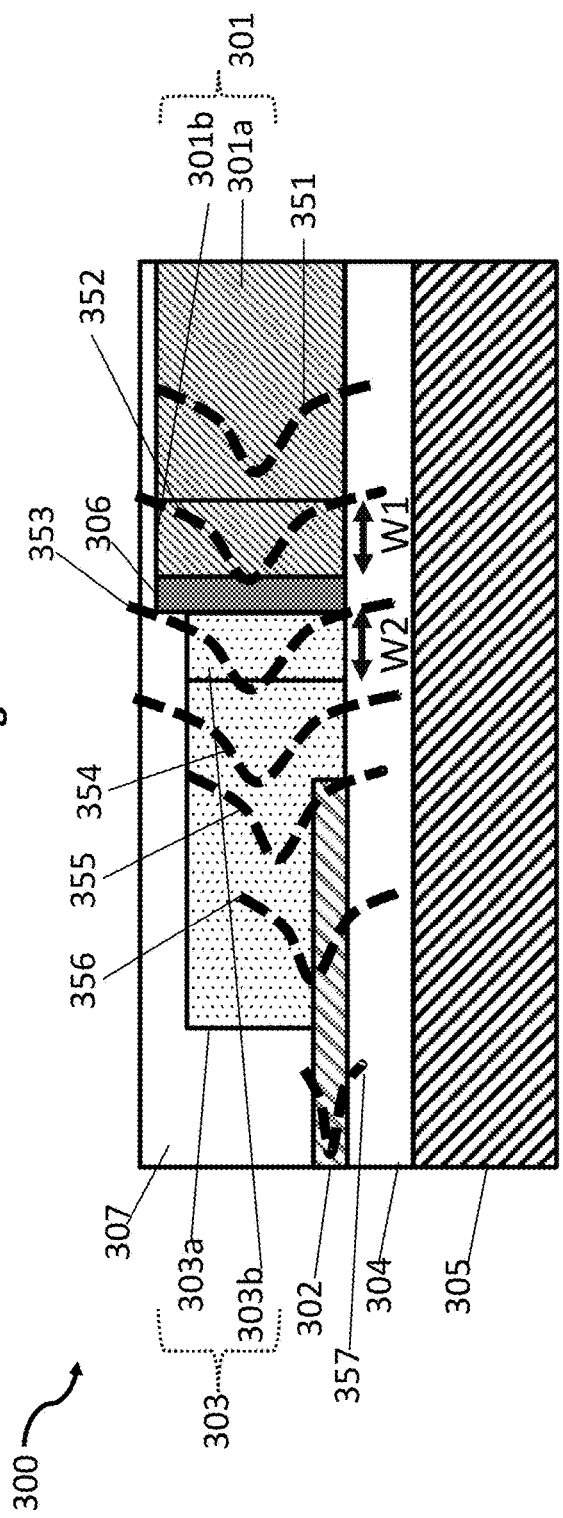
FIG. 3A illustrates a device according to one embodiment of the present invention, shown in cross-section side view.

FIG. 3A is a schematic cross-section view of an integrated photonic device 300 utilizing butt-coupling and mode conversion for efficient coupling between dissimilar materials.

Efficient coupling between one or more of the modes 357 supported by layer 302 and one or more of the modes 351 supported by 301a is facilitated by layer 303 (comprising 303a and in some embodiments both 303a and 303b), and, in cases where layer 306 is present, by both layers 303 and 306. Layer 303a serves as an intermediate waveguide that in some embodiments accepts the profile (depicted by dashed line 352) of an optical mode propagating in layer 301b, captures it efficiently as mode profile 353, transforms to mode 354, and gradually transfers it to mode profiles 355, 356 and finally 357. Said transition from 354 to 357 utilizes one or more tapers. Mode profile 357 is then efficiency supported by waveguide for which layer 102 provides the core. In other embodiments, the direction of travel may be reversed.

Layer 305 is a substrate as described with respect to FIG. 1B and layer 105. Layer 304 is optional and in one embodiment serves as lower cladding as described with respect to FIG. 1A and layer 104. Layer 307 serves as cladding as described with respect to FIG. 1B and layer 107.

The refractive index of layer 303 can be engineered to facilitate efficient coupling of mode profile 351 and to efficiently transform the mode to one with mode profile 357 by taking advantage of tapered structures made in layer 302 and/or 303. Prior to the present invention i.e. in the absence of intermediate layer 303, the requirements on taper tip width for direct transfer between layer 301a and 302 would be problematic. The use of intermediate layer 303 that is butt-coupled to layer 301, however, significantly reduces the stringent requirements on taper tip widths, allowing efficient transfer between very high refractive index materials (such as e.g. GaAs or GaN in layer 301) to low refractive index materials (such as e.g. SiN, SiO2 in layer 302). Layer 303 may comprise a dielectric, a polymer, and/or any other suitable material. No adiabatic transformation occurs between the optical modes supported by elements 301 and 303 at the butt-coupled interface, although of course it may occur at other places in the device, most particularly at any tapering of waveguide dimensions, between or at other interfaces.

Differences between the optical modes supported by waveguides in layers 301a and 302 respectively may or may not be obvious by observation of the mode profiles, but mode overlaps less than 100% could (in the absence of intermediate layer 303) result in significant optical loss. In some cases, it may be considered that losses of up to 1 dB are acceptable, but losses greater than that are not. In other cases, a 3 dB loss level may be the criterion chosen. The function of layer 303 is to keep optical loss due to imperfect mode overlap below whatever is determined to be an acceptable level in a given application.

Figure 3B:
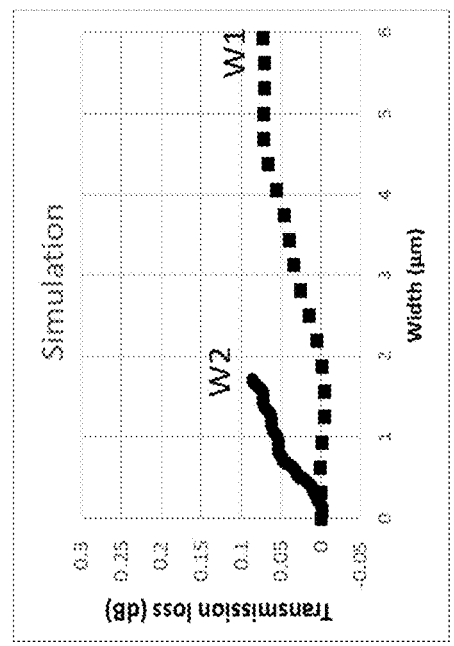
FIG. 3B provides simulation results for the effect of a wall in the embodiment of FIG. 3A.

Layer 301 is active layer comprising at least two functional parts 301a and 301b where 301a primarily serves as to provide active functionality including optical and electrical confinement, electric contacts, and/or other functionality. Layer 301b primarily serves as a wall as described with respect to FIGS. 1A and 1B (layer 101b) and FIG. 2A (layer 201b). The thickness or width of the layer 301b marked with W1 is an optimization parameter. In one embodiment, the width W1 is <500 nm or as narrow as lithography tools used to define the width is capable of resolving. In some embodiments, the width W1 is larger and is between 500 nm and 3000 nm providing superior thermal performance. In yet another embodiment, the thickness of W1 is larger than 3000 nm to provide even lower thermal impedance interface. Layer 301b accepts input mode 351 supported by 301a and propagates it as mode 352 that can gradually differ from the input mode as the wall structure 301b does not provide strong horizontal optical confinement. The exact dimensions are an optimization parameter defined by refractive indices of used materials, wavelength of operation and other considerations, but for an illustrative design, simulations 380 in FIG. 3B show transmission loss due to introduction of the wall 301b can be very low, and as low as <0.1 dB for wall widths in the excess of 5 μm.

Layer 303 in one embodiment comprises only layer 303a (not shown). In some embodiments, layer 303 comprises two layers 303a and 303b, where 303a primarily serves to support efficient transfer of the optimal mode using tapers as previously described. 303b serves as a wall, as described with respect to FIGS. 1 and 2 providing improved thermal performance and/or relaxing the alignment requirements between particular lithography steps.

The thickness or width of the layer 303b marked with W2 is an optimization parameter. In one embodiment, the width W2 is <500 nm or as narrow as necessary to compensate for lithography tool misalignment. In some embodiments, the width W2 is larger and is between 500 nm and 2000 nm providing better thermal performance and further relaxed alignment requirements. In yet another embodiment, the thickness of W2 is larger than 2000 nm. Layer 303b accepts mode 352 and propagates it as mode 353 that can gradually differ from the input mode as wall structure does not provide strong horizontal optical confinement. The exact dimensions are an optimization parameter defined by refractive indices of used materials, wavelength of operation and other considerations, but for an illustrative design, simulations 380 show transmission loss due to introduction of the wall 303b can be very low, and as low as <0.1 dB for wall widths in the excess of 1.5 µm.

Figure 4:
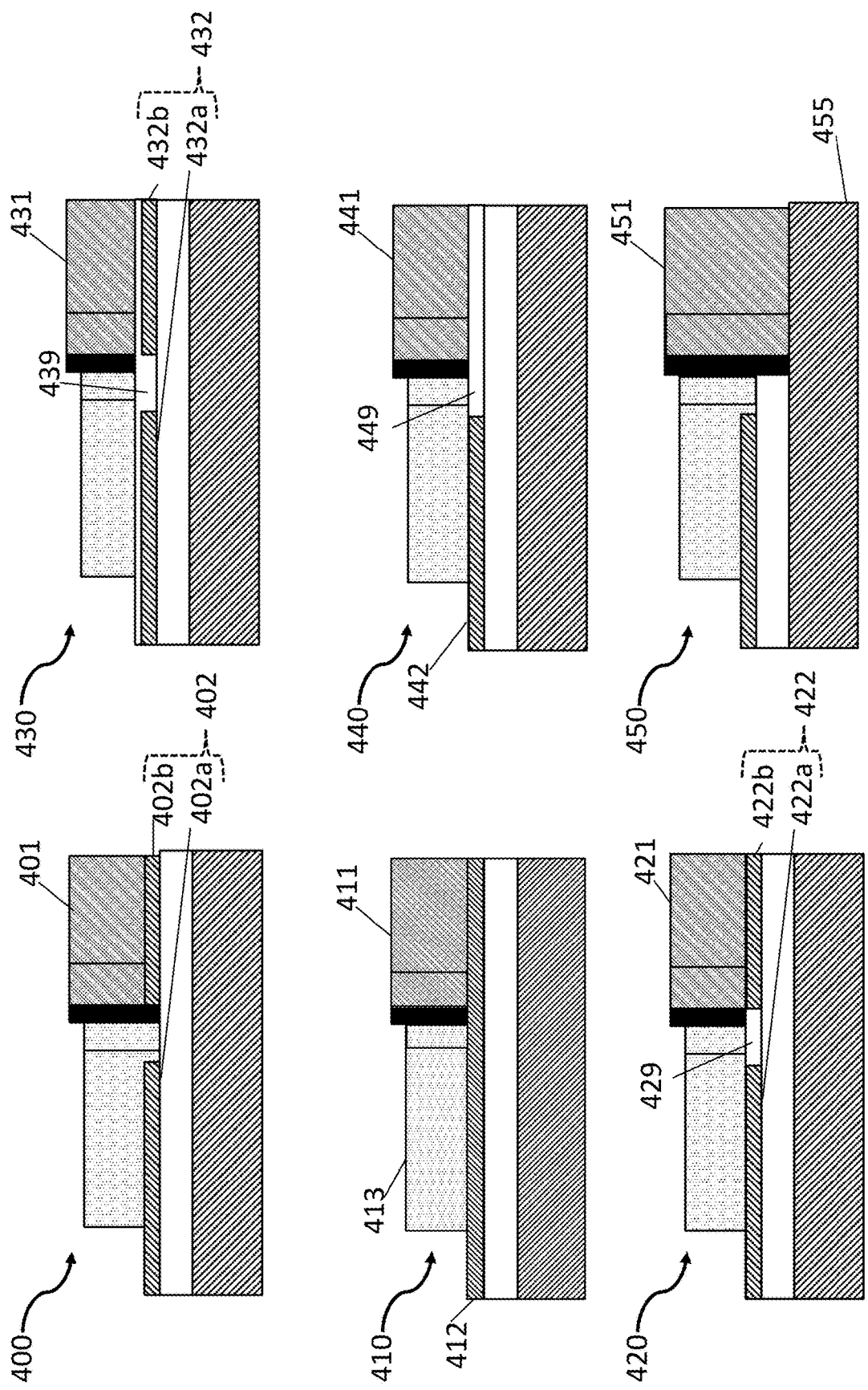
FIG. 4 illustrates devices according to several embodiments of the present invention, shown in cross-section side views.

FIG. 4 shows six schematic cross-section views of some embodiments of an integrated photonic device utilizing butt-coupling and mode conversion for efficient coupling between dissimilar materials.

In one embodiment, an integrated photonic device 400 bonds layer 401 on top of layer 402 that now comprises at least two parts 402a and 402b, in contrast to an embodiment shown in FIG. 3A where equivalent layers 301a and 301b are bonded on top of equivalent layer 304.

In yet another embodiment, an integrated photonic device 410 bonds active layer 411 on top of layer 412 that is continuous in this cross-section. Layer 412, when e.g. viewed from the top, can be patterned to provide waveguiding and other passive functionality including tapered dimensions while appearing uniformly continuous across a particular cut plane as sketched in 410.

In yet another embodiment, an integrated photonic device 420 active layer 421 is bonded on top of a planarized structure formed by patterned layer 422 (comprising 422a and 422b) and deposited layer 429. Said planarization can be performed by chemical mechanical polishing (CMP) or other etching, chemical and/or mechanical polishing methods. In other embodiments, the planarity is provided because of the intrinsic nature of the method by which layer 429 is deposited, for example if the material of layer 429 is a spin-on glass, polymer, photoresist or other suitable material. In the embodiments shown in 420, the deposited layer 429 is completely removed on top of layer 422a and/or 422b.

In yet another embodiment, an integrated photonic device 430 active layer 431 is bonded on top of a planarized structure formed by deposited layer 439. Layer 439 can be planarized by subsequent processing or by the nature of the deposition method, similarly to layer 429. In the embodiments shown in 430, the deposited layer 439 is not fully removed on top of 432 comprising layer 432a and/or 432b. In some embodiments thickness of that remaining layer 439 on top of layers 432a/432b is in the order of 10 nm to 100 nm. In yet another embodiment, it is thicker than 100 nm.

In yet another embodiment, an integrated photonic device 440 active layer 441 is bonded on top of a planarized layer 449 and layer 442 is completely removed under the layer 441. An advantage of this approach can be further improved coupling, improved quality of bonding, better thermal performance of layer 449 compared to layer 442, improved optical confinement control in layer 441, realization of electrical contacts using layer 449 and/or others.

In yet another embodiment, an integrated photonic device 450 active layer 451 is bonded directly to substrate 455.

An advantage of each approach can be higher quality surface of particular layer for bonding, additional mode control in the active region by using underlying layers including definition of gratings (that can e.g. provide filtering and/or other functionality), improved coupling due to better vertical alignment between mode centers, better thermal performance, realization of electrical contacts using other layers than the bonded active one and/or others. In all cases, the integration approach is compatible with introduction of one or more wall structures for improved facet quality and thermal performance as described with reference to FIGS. 1A through 3B.

FIG. 5 depicts a top-down view of a device 500 according to one embodiment of the present invention, where boundaries between dissimilar materials are angled to control both the transmission and back reflection. The optical mode supported by active layer 501 (comprising 501a and 501b) is guided through optional coating layer 506 (described in detail in relation to FIG. 1A and 106 and FIG. 2A and 206) to intermediate layer 503 (comprising 503a and 503b, where 503b is optional) that serves to convert the mode for efficient coupling to passive layer 502. To facilitate this transition, in one embodiment the dimensions of layer 502 are tapered down towards layer 501 as indicated by the relatively small width of the tip 510 relative to the width of layer 502 shown at the extreme left of the figure. As discussed above, the requirements on taper dimensions are significantly relaxed due to layer 503. In other embodiments, width of 503a can be tapered while width of 502 is kept constant. In yet another embodiment, both widths (of 502 and 503a) can be adjusted to facilitate more efficient optical coupling. Additionally, in this embodiment, one or more of the interfaces between layers 501a, 501b, 506, 503b and/or 503a are angled to reduce corresponding back reflection(s).

The angle 555 defines the angle between the tangent of the direction of propagation of the wave inside structure 501a and the wall 501b. Wall 501b has another angle (not explicitly shown) defined between the facet (interface toward 506 and/or 503b) and the tangent of the direction of propagation of the wave inside structure 501a. In some embodiments both angles are the same and vary between 1° and 45°. In some embodiments, the angles are substantially equal to 8°. In yet another embodiment, the two angles differ to further suppress potential frequency selectivity of the transmission and/or reflection due to multiple reflections at the interfaces.

In some embodiments, layer 506 is not present and 501b directly interacts with 503b. In yet another embodiment, both layer 506 and 503b are not present and 501b directly interacts with 503a.

The angle 550 defines the angle between the tangent of the direction of the propagation of the wave inside structure 501a and the angle of the optional wall 503b. In some embodiments said angle is 0°. In yet another embodiment, said angle is equal to angle 555. In yet another embodiment, said angle 550 is between 1° and 45°, while being substantially different than angle 555.

The angle 560 defines the angle between the direction of the propagation of the wave inside the structure 501a and the angle of the waveguide formed by 503a. Said angle is an optimization parameter for coupling efficiency and is related to the choice of the angle 550, angle 555, and/or refractive indices of used materials. In one embodiment it is substantially equal to 0°. In yet another embodiment it is between 1° and 45°. In yet another embodiment it is substantially equal to 8°.

Precise vertical alignment between the axis defined by the direction of the propagation of the wave inside the structure 501a and the center of the waveguide 503a at the interface to 503b, 506 and/or 501b is an optimization parameter where such offset can be positive (up in FIG. 5), negative (down in FIG. 5) and/or substantially equal to 0 (no offset). Such optimization is straightforward to perform with numerical software to maximize the performance of the transition.

Prior to the present invention i.e. in the absence of intermediate layer 503, the requirements on taper tip width for direct transfer between layer 501a and 502 would be problematic. The use of intermediate layer 503 that is butt-coupled, albeit with angled interface, to layer 501, however, significantly reduces the stringent requirements on taper tip widths, allowing efficient transfer between very high refractive index materials (such as e.g. GaAs or GaN in layer 501) to low refractive index materials (such as e.g. SiN, SiO2 in layer 502). Layer 503 may comprise a dielectric, a polymer, and/or any other suitable material. No adiabatic transformation occurs between the optical modes supported by elements 501 and 503 at the butt-coupled interface. Layer 503a and/or layer 502 can comprise bends (not shown) to control the routing of the guided optical waves. One or more lithography alignment marks 540 are present to facilitate precise alignment between the layers formed during various processing steps.

Figure 6:
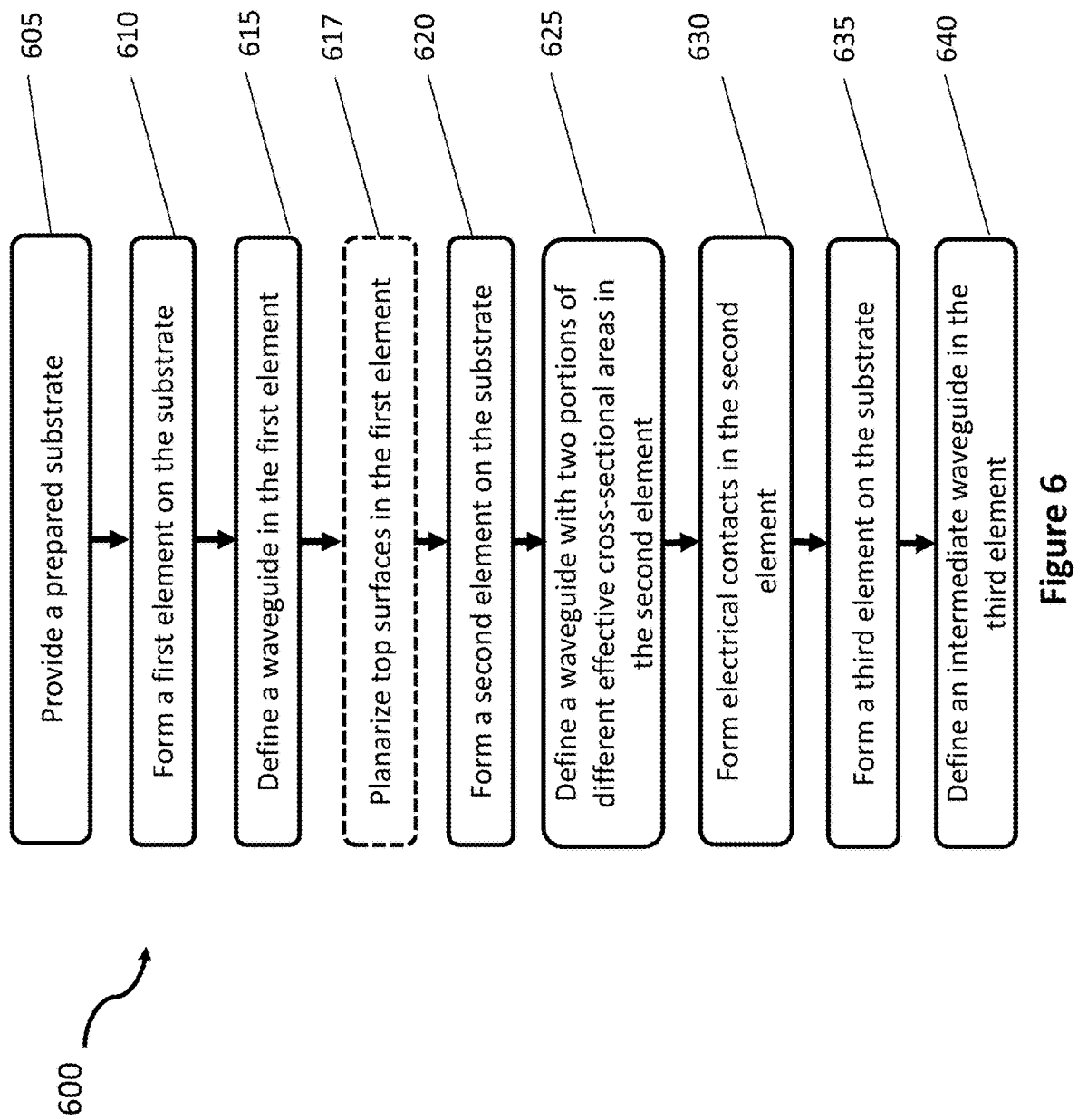
FIG. 6 is a process flow diagram of a method according to some embodiments of the present invention.

FIG. 6 is a process flow diagram of a method according to embodiments of the present invention, showing some of the operations carried out to make integrated devices of the types described above.

Method 600 for making the devices need not always include all the functions, operations, or actions shown, or to include them in exactly the sequence illustrated by the sequence from blocks 605 through 640 as shown. In an exemplary case, however, method 600 begins with block, 605, in which a substrate, suitably prepared for subsequent processing steps, is provided. Method 600 may then proceed from block 605 to block 610, where a first element, comprising one or more dielectric materials, is formed on the prepared substrate, by deposition, growth, transfer, bonding or some other well-known technique.

From block 610, method 600 may proceed to block 615 where a waveguide, and optionally other structures, such as, but not limited to, couplers, filters, resonators, etc. are defined in the first element, the waveguide comprising a core layer (102 in the case of FIG. 1) and optionally a lower cladding layer (104 in the case of FIG. 1B). Subsequent steps (not shown) might include additional material deposition or removal in preparation for optional step 617.

At block 617, an optional additional process step is introduced, in which the top surfaces in the first element are planarized. As discussed above, this may be achieved by depositing a layer of relatively low refractive index on top of the topmost (waveguide) layer of the partially fabricated device, and then, if the method of deposition does not intrinsically provide a planar top surface, carrying out a deliberate planarization process such as CMP. The planarization may be controlled to leave a layer of desired, typically very low, thickness on top of the waveguide layer (as e.g. for device 430), or to remove all of the deposited material above the level of the top surface of that waveguide layer (as e.g. for device 420)

The method proceeds to block 620, either from block 615 if block 617 was not implemented, or from block 617 if block 617 was implemented. In block 620 a second element, typically involving an active semiconductor material, is bonded on the top surface of the structure (multiple embodiments are shown in FIG. 4). Said bonding can be direct molecular bonding or can use additional materials to facilitate bonding such as e.g. metal layers or polymer films as is known in the art.

From block 620, method 600 may proceed to block 625, where a waveguide (101a/101b in FIG. 1A) and optionally other structures, such as, but not limited to, couplers, filters, resonators, detectors, amplifiers, optical sources are defined in the second element. Next, at step 630, electrical contacts may be formed in the second element. In embodiments where the second element is used to provide a semiconductor light source, these contacts are used to drive the light source to generate light. In embodiments where the second element is used to provide a photodetector, these contacts may be used to convey the photodetector output signals.

Steps (not shown) subsequent to steps 625 and/or 630 might include additional material deposition or removal in preparation for step 635, in which a third element, comprising one or more dielectric, polymer and/or other materials, is formed (by deposition, growth, transfer, bonding or some other well-known technique) in a location between and in contact with the first and second elements, Next, at step 640, an intermediate waveguide is defined in the third element including the optional wall.

Further processing of the various dielectric and/or semiconductor layers, and/or electrical contacts, vias and the addition and processing of index matching layers, upper cladding, bonding pads, etc may be performed as is known in the art.

Embodiments of the present invention offer many benefits. The integration platform enables scalable manufacturing of PICs made from multiple materials and capable of covering a wide wavelength range from visible to IR and handling high optical power compared to typical Si waveguide-based or InP waveguide-based PICs.

Previous approaches have generally used taper structures in order to transfer an optical mode from an active device to a passive device, where a width of compound semiconductor region is adiabatically tapered down to sub-micron size. However, a required width of the taper tip decreases rapidly to tens of nanometer sizes as the difference in refractive indices increases. The present invention deploys a butt coupling scheme to eliminate the need of a very small taper size in the compound semiconductor waveguide, which eases fabrication of such structures. Furthermore, the invention enables high on-chip optical powers by optimizing the interfaces between different materials in terms of process quality, thermal resistance and/or others.

Other approaches have relied on die attachment of prefabricated optical active devices to passive waveguides. This requires very stringent alignment accuracy which is typically beyond what a typical die-bonder can provide. This aspect limits the throughput of this process as well as the performance of optical coupling.

This present invention utilizes a process flow consisting of typically wafer-bonding of a blanket piece of compound semiconductor material on a carrier wafer with dielectric waveguides and subsequent semiconductor fabrication processes as is known in the art. It enables an accurate definition of optical alignment between active and passive waveguides via typically photo lithography step, removing the need for precise physical alignment. Said photo lithography-based alignment allows for scalable manufacturing using wafer scale techniques.

Efficient optical transfer between dissimilar materials is facilitated by using a butt-coupling approach in combination with a mode-converter (the intermediate waveguide) that removes the need for narrow taper tips that are challenging to resolve and fabricate with current state-of-the-art tools.

It is to be understood that optical coupling between modes in active and passive layers is reciprocal, so that, taking FIG. 1A as exemplary, the structure can be configured to facilitate light transmission from region 101a to region 102, but also to facilitate transmission in the reverse direction, from region 102 to region 101a. In is to be understood that multiple such transitions with no limitation in their number or orientation can be realized on a suitably configured PIC.

In some embodiments the active region can utilize the substrate for more efficient thermal sinking, due to direct contact to the substrate with no dielectric in-between. In such embodiments, active region fully defines the optical waveguide in active region and transitions to passive region via the above mentioned butt-coupling.

In some embodiments, the active region creates a hybrid waveguide structure with dielectric layers which can be used, for example, to create a wavelength selective component formed inside the laser cavity for e.g. distributed feedback (DFB) lasers or similar components.

Embodiments of the optical devices described herein may be incorporated into various other devices and systems including, but not limited to, various computing and/or consumer electronic devices/appliances, communication systems, sensors and sensing systems.

It is to be understood that the disclosure teaches just few examples of the illustrative embodiment and that many variations of the invention can easily be devised by those skilled in the art after reading this disclosure and that the scope of the present invention is to be determined by the following claims.

The invention claimed is:

1. A device comprising:
   first, second and third elements fabricated on a common substrate;
   the first element comprising:
      an active waveguide structure comprising:
         a first portion, characterized by a first effective cross-sectional area, supporting a first optical mode; and
         a second portion, butt-coupled to the first portion, characterized by a second effective cross-sectional area greater than the first effective cross-sectional area;
   the second element comprising a passive waveguide structure supporting a second optical mode; and
   the third element, at least partly butt-coupled to the second portion of the waveguide structure in the first element, comprising an intermediate waveguide structure supporting intermediate optical modes;
   wherein, if the first optical mode differs from the second optical mode by more than a predetermined amount, a tapered waveguide structure in at least one of the second and third elements facilitates efficient adiabatic transformation between the second optical mode and one of the intermediate optical modes;
   wherein no adiabatic transformation occurs between any of the intermediate optical modes and the first optical mode; and
   wherein mutual alignments of the first, second and third elements are defined using lithographic alignment marks.

2. The device of claim 1,
   wherein at least one of an interface between the first portion of the first element and the second portion of the first element, and an interface between the second portion of the first element and the third element, is angled at an angle optimized to reduce back reflection.

3. The device of claim 2, further comprising:
   an anti-reflective coating layer between the first and third elements.

4. The device of claim 1, further comprising:
   a high reflectivity coating layer between the first and third elements.

5. The device of claim 1,
   wherein the second element is characterized by a planarized top surface, underlying a bottom surface of the third element.

6. The device of claim 5,
   wherein at least one of an interface between the first portion of the first element and the second portion of the first element, and an interface between the second portion of the first element and the third element, is angled at an angle optimized to reduce back reflection.

7. The device of claim 6, further comprising:
   an anti-reflective coating layer between the first and third elements.

8. The device of claim 5,
   wherein the third element comprises a first portion, characterized by a third effective cross-sectional area, and a second portion, characterized by a fourth effective cross-sectional area greater than the third cross-sectional area.

9. The device of claim 8,
   wherein at least one of an interface between the first portion of the first element and the second portion of the first element, an interface between the second portion of the first element and second portion of the third element, and an interface between the second portion of the third element and the first portion of the third element, is angled at an angle optimized to reduce back reflection.

10. The device of claim 9, further comprising:
    an anti-reflective coating layer between the first and third elements.

11. The device of claim 8, further comprising:
    a high reflectivity coating layer between the first and third elements.

12. The device of claim 5, further comprising:
    a high reflectivity coating layer between the first and third elements.

13. The device of claim 1,
    wherein the third element comprises a first portion, characterized by a third effective cross-sectional area, and a second portion, characterized by a fourth effective cross-sectional area greater than the third cross-sectional area.

14. The device of claim 3,
    wherein at least one of an interface between the first portion of the first element and the second portion of the first element, an interface between the second portion of the first element and second portion of the third element, and an interface between the second portion of the third element and the first portion of the third element, is angled at an angle optimized to reduce back reflection.

15. The device of claim 14, further comprising:
    an anti-reflective coating layer between the first and third elements.

16. The device of claim 13, further comprising:
    a high reflectivity coating layer between the first and third elements.

17. A method for making a device; the method comprising:
    forming a first element, comprising a dielectric material, on a substrate;
    defining a waveguide, configured to support a first optical mode, in the first element;
    attaching a second element comprising an active material to the substrate;
    defining a waveguide in the second element where its position relative to the first element is defined by lithographic alignment marks, the waveguide in the second element comprising:
  a first portion, characterized by a first effective cross-sectional area, supporting a second optical mode; and
  a second portion, butt-coupled to the first portion, characterized by a second effective cross-sectional area greater than the first effective cross-sectional area;
forming electrical contacts in the second element; and
forming, on the substrate, a third element between and in contact with the first and second elements, the position of the third element relative to the first and second element being defined by lithographic alignment marks; and
defining an intermediate waveguide in the third element, the intermediate waveguide being configured to support intermediate optical modes;
wherein at least one of the intermediate waveguide and the waveguide in the first element is tapered to facilitate adiabatic transformation between the first optical mode and one of the intermediate optical modes if the first optical mode differs from the second optical mode by more than a predetermined amount;
wherein the third element is at least partly butt-coupled to the second portion of the waveguide in the second element; and
wherein no adiabatic transformation occurs between any of the intermediate optical modes and the second optical mode.

18. The method of claim 17, further comprising:
after defining a waveguide, configured to support a first optical mode, in the first element, and before attaching a second element comprising an active material to the substrate,
planarizing a top surface of the first element.

19. The method of claim 18,
wherein the active material is capable of light generation, amplification and/or detection.

20. The method of claim 17,
wherein the active material is capable of light generation, amplification and/or detection.

* * * * *